United States Patent
Kim

(10) Patent No.: US 7,457,157 B2
(45) Date of Patent: Nov. 25, 2008

(54) NAND FLASH MEMORY DEVICES AND METHODS OF LSB/MSB PROGRAMMING THE SAME

(75) Inventor: Hyung-Gon Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 299 days.

(21) Appl. No.: 11/279,067

(22) Filed: Apr. 7, 2006

(65) Prior Publication Data

US 2007/0014163 A1     Jan. 18, 2007

(30) Foreign Application Priority Data

Jul. 12, 2005     (KR) .................... 10-2005-0062787

(51) Int. Cl.
G11C 16/10     (2006.01)
G11C 16/34     (2006.01)
G11C 16/06     (2006.01)
G11C 7/10     (2006.01)

(52) U.S. Cl. .................... 365/185.03; 365/185.08; 365/185.22; 365/189.05; 365/185.17; 365/185.24

(58) Field of Classification Search ............ 365/185.03, 365/185.08, 185.22, 189.05, 185.17, 195, 365/185.24; 711/103, 118, 119, 122
See application file for complete search history.

(56) References Cited

U.S. PATENT DOCUMENTS

| | | | | |
|---|---|---|---|---|
| 5,521,865 A | * | 5/1996 | Ohuchi et al. .......... | 365/185.22 |
| 5,768,188 A | | 6/1998 | Park et al. | |
| 5,862,074 A | | 1/1999 | Park | |
| 5,903,495 A | * | 5/1999 | Takeuchi et al. ....... | 365/185.03 |
| 5,966,326 A | | 10/1999 | Park et al. | |
| 6,178,115 B1 | * | 1/2001 | Shibata et al. ......... | 365/185.03 |
| 6,456,528 B1 | * | 9/2002 | Chen ..................... | 365/185.03 |
| 6,937,510 B2 | | 8/2005 | Hosono et al. | |
| 6,963,509 B1 | * | 11/2005 | Ju ......................... | 365/189.05 |
| 6,967,872 B2 | * | 11/2005 | Quader et al. .......... | 365/185.22 |
| 2002/0126531 A1 | | 9/2002 | Hosono et al. | |
| 2003/0117856 A1 | | 6/2003 | Lee et al. | |

FOREIGN PATENT DOCUMENTS

| | | |
|---|---|---|
| JP | 10-106279 A | 4/1998 |
| JP | 10-125083 A | 5/1998 |
| JP | 2001-325796 A | 11/2001 |
| KR | 10-0205240 B1 | 4/1999 |
| KR | 10-0204803 B1 | 8/1999 |
| KR | 10-0458408 B1 | 11/2004 |

OTHER PUBLICATIONS

Notice to File a Response/Amendment to the Examination Report, with English language translation, KR Application No. 10-2005-0062787, Aug. 29, 2006.

* cited by examiner

*Primary Examiner*—J. H. Hur
(74) *Attorney, Agent, or Firm*—Myers Bigel Sibley & Sajovec, P.A.

(57) ABSTRACT

Multiple bits are programmed in a NAND flash memory device by programming a memory cell with an LSB; storing the LSB into a cache register from the memory cell; programming the memory cell with an MSB that is stored in a main register; storing a data bit into the main register from the memory cell during a first verifying operation; storing a data bit into the cache register from the memory cell during a second verifying operation; and transferring the data bit to the main register from the cache register.

16 Claims, 8 Drawing Sheets

NAND FLASH MEMORY DEVICES AND METHODS OF LSB/MSB PROGRAMMING THE SAME

CROSS-REFERENCE TO RELATED APPLICATIONS

This application claims the priority of Korean Patent Application No. 10-2005-0062787, filed on Jul. 12, 2005, in the Korean Intellectual Property Office, the disclosure of which is incorporated herein in its entirety by reference.

FIELD OF THE INVENTION

This invention relates to integrated circuit memory devices, and more particularly, to NAND flash memory devices capable of storing multi-bit data and methods of programming the same.

BACKGROUND OF THE INVENTION

Integrated circuit memory devices are widely used for consumer, commercial and many other applications. Integrated circuit memory devices store data able to be retrieved therefrom, which are roughly classified into random-access memories (RAMs) and read-only memories (ROMs). The RoAMs are volatile memory devices that do not retain data when power is suspended or interrupted, including dynamic RAMs, and static RAMs. The ROMs have nonvolatile properties keeping data even without power being supplied, including programmable ROMs, erasable and programmable ROMs, electrically erasable and programmable ROMs, and flash memories. The flash memory devices may be classified into NAND and NOR types.

FIG. 1 is a block diagram showing a general configuration of a NAND flash memory device. As shown in FIG. 1, the flash memory device 10 is includes a memory cell array 12, a row decoder 14, and a page buffer 16. The memory cell array 12 is composed of a plurality of memory cells connected with wordlines WL0~WL$_{n-1}$ and bitlines BL0~BL$_{n-1}$. The wordlines WL0~WL$_{n-1}$ are driven by a row decoder 14 and the bitlines BL0~BL$_{n-1}$ are driven by the page buffer 16.

Technologies have recently been developed that are capable of selectively storing multi-bit data in a single memory cell of the NAND flash memory device. The memory cell is set in one of multiple states in accordance with a predetermined data condition, which is called multi-level cell (MLC). For example, a memory cell storing 2-bit data is conditioned in one of four states, '11', '10', '00', or '01'.

As the memory cell of the NAND flash memory device is able to store 1-bit data (i.e., a single bit) or multi-bit data, the page buffer 16 may be designed with different patterns in accordance with the bit pattern, i.e., 1-bit or multi-bit, of the NAND flash memory device. For instance, a page buffer for processing 1-bit data may include a single latch, while a page buffer for processing 2-bit data may include two latches.

SUMMARY OF THE INVENTION

Some embodiments of the invention provide methods of programming multiple bits in a NAND flash memory device. These methods comprise programming a memory cell with a Least Significant Bit (LSB); storing the LSB into a cache register from the memory cell; programming the memory cell with a Most Significant Bit (MSB) that is stored in a main register; storing a data bit into the main register from the memory cell during a first verifying operation; storing a data bit into the cache register from the memory cell during a second verifying operation; and transferring the data bit to the main register from the cache register.

In some embodiments, the first verifying operation is a '00' verifying operation. If the memory cell is conditioned in a '00' state after the '00' verifying operation, the main register is set for program inhibition.

In some embodiments, the second verifying operation is a '01' verifying operation. If the memory cell is conditioned in a '01' state after the '01' verifying operation, the data bit of the cache register is changed. The main register is set for program inhibition in accordance with the changed data bit of the cache register. Otherwise, if a threshold voltage of the memory cell is higher than a '00' verifying voltage but lower than a '01' verifying voltage, after the '01' verifying operation, the data bit of the cache register is maintained without change. The main register is set to conduct a programming operation in accordance with the data bit of the cache register.

In some embodiments, the method further comprises, after programming the LSB into the memory cell: resetting the cache register; loading the MSB in the cache register; resetting the main register; and transferring the MSB to the main register from the cache register.

In some embodiments, programming the LSB comprises resetting the cache register; loading the LSB in the cache register; resetting the main register; dumping the LSB to the main register from the cache register; and executing an LSB programming operation in accordance with the LSB of the main register. The method can further comprise, after the LSB programming operation: executing a third verifying operation by applying a third verifying voltage, which is lower than a voltage of the first verifying operation, to the memory cell. The third verifying operation can be a '10' verifying operation. If the memory cell is conditioned in a '10' state after the '10' verifying operation, the main register is set for program inhibition.

Other embodiments of the invention can also provide NAND flash memory devices. These devices comprise a memory cell configured to store multi-bit data; a main register configured to store data to be programmed in the memory cell; a cache register configured to store data supplied from an external source; a sensing circuit configured to enable storing data from the memory cell into the cache register during an initial read operation, storing data from the memory cell into the main register during a first verifying operation, and storing data from the memory cell into the cache register during a second verifying operation; and a dumping circuit configured to transfer data from the cache register to the main register.

In some embodiments, the first verifying operation is a '00' verifying operation. If the memory cell is conditioned in a '00' state after the '00' verifying operation, the main register is set for program inhibition. Moreover, in some embodiments, the second verifying operation is a '01' verifying operation. If the memory cell is conditioned in a '01' state after the '01' verifying operation, the main register is set for program inhibition. However, if a threshold voltage of the memory cell is higher than a '00' verifying voltage but lower than a '01' verifying voltage, after the '01' verifying operation, the main register is set to conduct a programming operation. The main register also may be set to conduct the programming operation in accordance with the data bit of the cache register.

Accordingly, some embodiments of the present invention provide methods of programming a multi-bit memory cell from a lowest threshold state to a highest threshold state, and related devices Programming may take place by verifying that an intermediate threshold state, between the lowest threshold state and the highest threshold state, has been successfully programmed, while allowing further programming of the multi-bit memory cell that has been successfully programmed, from the intermediate threshold to the highest threshold state. In some embodiments, it is verified that an MSB of the multi-bit memory cell has been successfully programmed, while still allowing further programming of an LSB of the multi-bit memory cell.

DETAILED DESCRIPTION OF PREFERRED EMBODIMENTS

Figure 1:
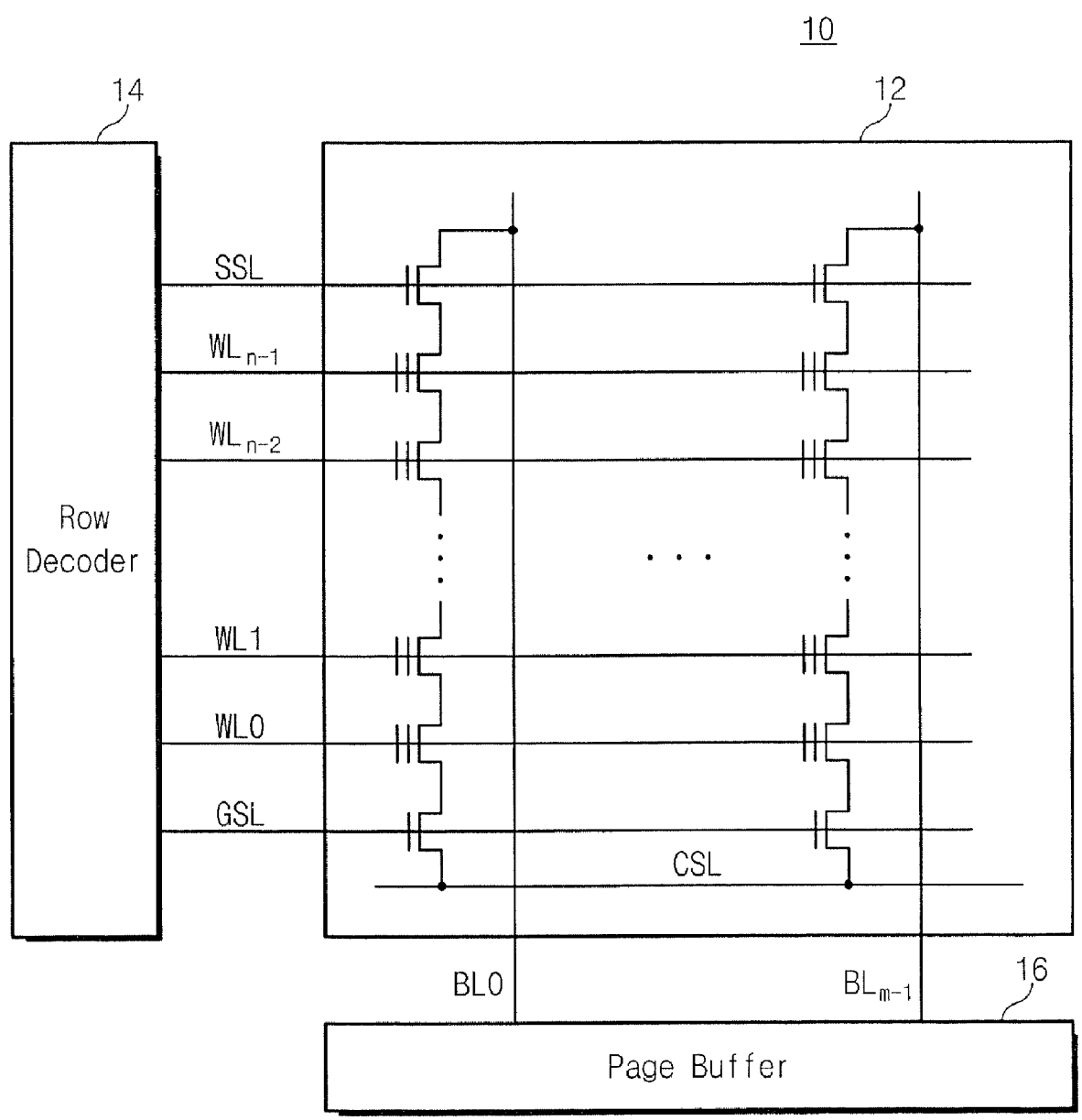
FIG. 1 is a block diagram showing a general configuration of a NAND flash memory device.

The present invention is described more fully hereinafter with reference to the accompanying drawings, in which example embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. Moreover, each embodiment described and illustrated herein includes its complementary conductivity type embodiment as well. Like numbers refer to like elements throughout.

It will be understood that when an element is referred to as being "responsive to," "connected to" or "coupled to" another element, it can be directly responsive, connected or coupled to the other element or intervening elements may be present. In contrast, when an element is referred to as being "directly responsive to," "directly connected to" or "directly coupled to" another element, there are no intervening elements present. Like reference numerals refer to like elements throughout. As used herein, the term "and/or" includes any and all combinations of one or more of the associated listed items, and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a", "lan" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present invention is described in part below with reference to block diagrams and/or flowcharts of methods, systems and computer program products according to embodiments of the invention. It will be understood that a block of the block diagrams and/or flowcharts, and combinations of blocks in the block diagrams and/or flowcharts, may be implemented at least in part by computer program instructions. Combinations of general purpose computer systems and/or special purpose hardware also may be used in other embodiments. Accordingly, a given block or blocks of the block diagrams and/or flowcharts provides support for methods, computer program products and/or systems (structural and/or means-plus-function).

It should also be noted that in some alternate implementations, the functions/acts noted in the flowcharts may occur out of the order noted in the flowcharts. For example, two blocks shown in succession may in fact be executed substantially concurrently or the blocks may sometimes be executed in the reverse order, depending upon the functionality/acts involved. Finally, the functionality of one or more blocks may be separated and/or combined with that of other blocks.

Unless otherwise defined, all terms (including technical and scientific terns) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
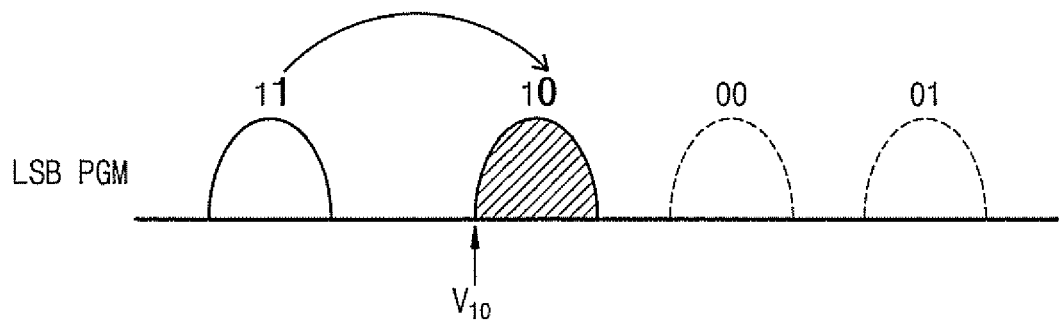
FIGS. 2A and 2B are schematic diagrams illustrating multi-level cell (MLC) programming operations in accordance with some embodiments of the invention.
Figure 2B:
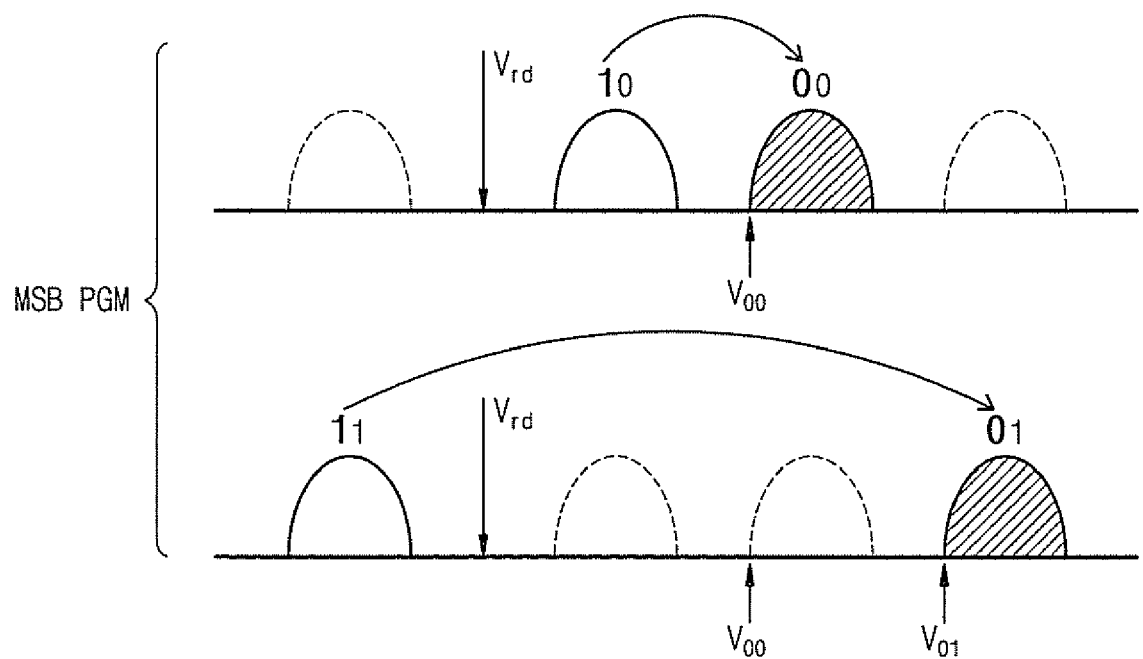

FIGS. 2A and 2B are schematic diagrams illustrating multi-level cell (MLC) programming operations in accordance with some embodiments of the invention, which corresponds to the case of programming 2-bit data into a memory cell.

According to the MLC programming operation, the memory cell is conditioned in one of data states '11', '10', '00' and '01'. A memory cell of the data state '11' is an erased cell, having the lowest threshold voltage. A memory cell of the data state '10' has a threshold voltage higher than that of a memory cell of the data state '11'. A memory cell of the data state '01' has a threshold voltage higher than that of a memory cell of the data state '00'.

FIG. 2A shows MLC programming operations for the Least Significant Bit (LSB), while FIG. 2B shows MLC programming operations for the Most Significant Bit (MSB). Assuming that data to be programmed is '10', '0' is LSB and '1' is MSB. By the LSB programming operation, a memory cell turns to the '11' or '10' state. By the MSB programming operation, a memory cell of the '10' state is programmed into the '00' state while a memory cell of the '11' state is programmed into the '01' state.

In FIG. 2A, a verifying voltage for the '10' state, $V_{10}$, is provided to check out whether the programmed memory cell is conditioned in a threshold voltage higher than the level of the '10' state. In FIG. 2B, verifying voltages for the '00' and '01' states, $V_{00}$ and $V_{01}$, are provided to check out whether the programmed memory cell is conditioned in a threshold voltage higher than the levels of the '00' and '01' states, respectively. An initial read voltage Vrd is also provided to detect whether the programmed memory cell is conditioned in the '11' or '10' state.

If a memory cell once programmed into the '00' state from the '10' state has a threshold voltage lower than the '00' verifying voltage $V_{00}$, the memory cell is referred to as being failed. In contrast, if the memory cell once programmed into the '00' state from the '10' state has a threshold voltage higher than the '00' verifying voltage $V_{00}$, it is referred to as being passed, After the '00' verifying operation, the memory cell once programmed into the '00' state is detected as being passed, the memory cell of the '00' state is designated as a program-inhibited cell in the subsequent programming operation. But, the memory cell referred as being failed is further put into the programming operation until it reaches the '00' state.

Now, assume that a memory cell once programmed into the '01' state from the '11' state has a threshold voltage higher than the '00' verifying voltage $V_{00}$ but lower than the '01' verifying voltage $V_{01}$. Then, the memory cell may be detected as being passed during the '00' verifying operation. However, the memory cell should be detected as being failed during the '01' verifying operation. If not, the memory cell cannot be further programmed, because it is defined as a program-inhibited cell in the next programming operation. After the MSB programming operation, if the memory cell has a threshold voltage higher than the '01' verifying voltage $V_{01}$, it will be referred as being passed. The memory cell reaching the '01' state is inhibited from programming (i.e., designated as a program-inhibited cell) in the next cycle.

NAND flash memory devices and methods of programming, according to some embodiments of the invention, prevent a memory cell from being set as a program-inhibited cell, even before it reaches the '01' state, in conducting the MSB programming operation to change tie memory cell to the '01' state from the '11' state. Specifically, according to some embodiments of the invention, programming of a multi-bit memory cell from the lowest threshold state to a highest threshold state may be performed by verifying that an intermediate threshold state, between the lowest threshold state and the highest threshold state, has been successfully programmed, while allowing further programming of the multi-bit memory cell that has been successfully programmed, from the intermediate threshold state to the highest threshold state. In some embodiments, it is verified that a Most Significant Bit of the multi-bit memory cell has been successfully programmed, while still allowing further programming of a Least Significant Bit of a multi-bit memory cell.

Figure 3:
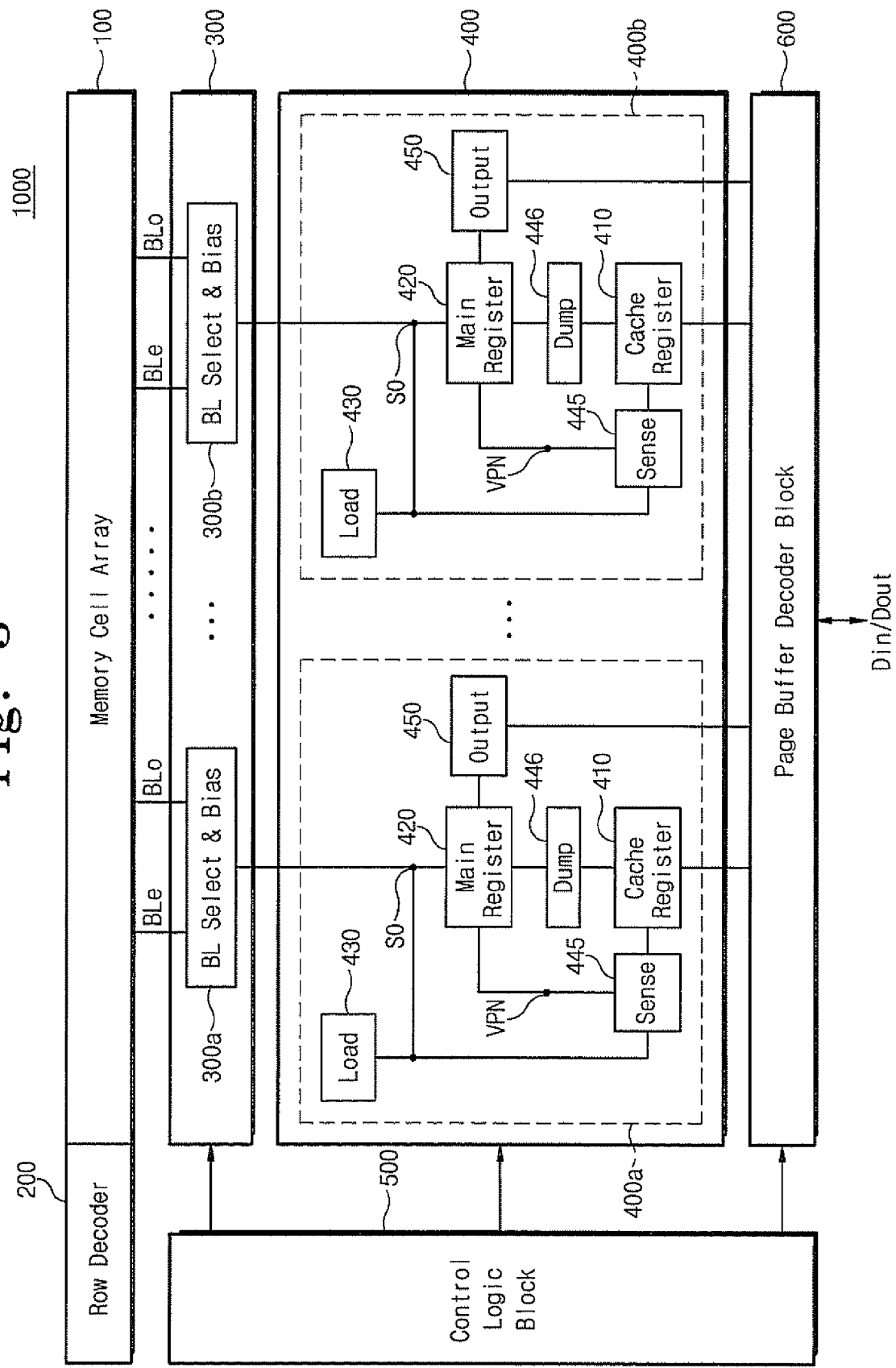
FIG. 3 is a block diagram illustrating a NAND flash memory device in accordance with some embodiments of the invention.

FIG. 3 is a block diagram illustrating a NAND flash memory device in accordance with some embodiments of the invention. The NAND flash memory device 100 is comprised of a memory cell array 100, a row decoder 200, a bitline selection and bias block 300, a page buffer block 400, a control logic block 500, and a page-buffer decoder block 600.

The memory cell array 100 includes a plurality of memory cells (not shown) coupled to wordlines and bitlines. Each memory cell is able to store 1-bit data (i.e., a single bit) or multi-bit data (e.g., 2 bits). The design and fabrication of multi-bit memory cells is well known to those having skill in the art and need not be described further herein.

The row decoder 200 selects one of the plural wordlines and applies a wordline voltage to the selected wordline. For instance, the row decoder 200 supplies a program voltage Vpgm to the selected wordline while supplying a pass voltage Vpass to remaining deselected wordlines.

The bitline selection and bias block 300 is regulated by the control logic block 500, being configured to partially select and activate the bitlines. For example, the bitline selection and bias block 300 is constructed to alternately select odd-ordered bitlines BLo or even-ordered bitlines BLe among the bitlines during the programming operation. The bitline selection and bias block 300 is composed of plural units of bitline selection and bias circuits 300a~300b. Each of the bitline selection and bias circuits 300a~300b is configured to select one of the even and odd-ordered bitlines BLe and BLo.

The page buffer block 400 operates as a sense amplifier or a writing driver in accordance with an operation mode. For example, during the programming operation, the page buffer block 400 stores data bits input through the page-buffer decoding block 600, and drives selected bitlines on a program-enhancing voltage (e.g., a ground voltage) or a program-inhibiting voltage (e.g., a power supply voltage) in compliance with data stored therein. The page buffer block 400 is regulated by the control logic block 500, being composed of plural page buffers 400a~400b corresponding respective to the bitline selection and bias circuits 300a~300b. As the page buffers 400a~400b are in the same structure, the following description will refer just to one of them, e.g., 400a, as an example, in describing the page buffer and the peripherals in further detail.

The page buffer 400a is comprised of a cache register 410, a main register 420, a loading circuit 430, a sensing circuit 445, a dumping circuit 446, and a data output circuit 450. The page buffer 400a functions to prevent a memory cell, which is designed to be programmed to the '01' state from the '11' state for MSB, from being designated as programmed even before it reaches the '01' state.

The cache register 410 is electrically connected directly to a virtual power node VPN. The main register 420 is electrically connected directly to a sensing node SO and the virtual power node VPN, supplying a current to the sensing node SO. The data output circuit 450 is configured to transfer a data bit from the main register 420 to the page-buffer decoding circuit 600. The sensing circuit 445 is connected to the sensing node SO and the virtual power node VPN. The dumping circuit 446 is arranged to be shared by the cache and main registers 410 and 420. NAND flash memory devices according to some embodiments of the invention are operable in the MLC programming mode by means of the page buffer shown in FIG. 3.

Figure 4:
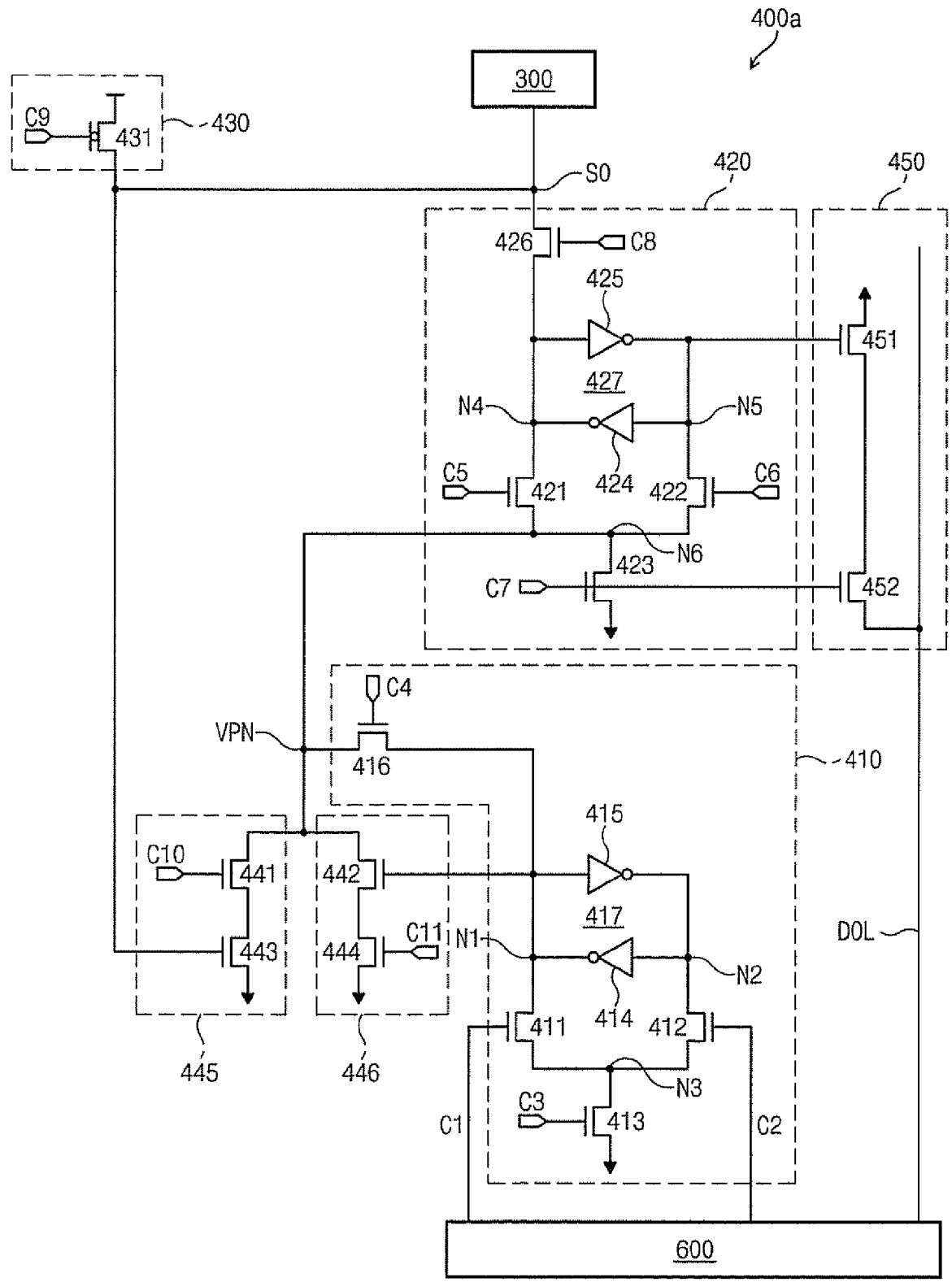
FIG. 4 is a circuit diagram of a page buffer shown in FIG. 3.

FIG. 4 is a circuit diagram of the page buffer 400a shown in FIG. 3. Referring to FIG. 4, the page buffer 400a is comprised of the cache register 410, the main register 420, the loading circuit 430, the sensing circuit 445, the dumping circuit 446, and the data output circuit 450.

The cache register 410 includes a cache latch 417 and four NMOS transistors 411, 412, 413, and 416. The cache latch 417 is composed of first and second inverters 414 and 415. The first and second inverters, 414 and 415, are connected between first and second nodes N1 and N2.

The NMOS transistor 411 is connected between the first node N1 and a third node N3, being turned on or off in response to a first control signal C1. The NMOS transistor 412 is connected between the second node N2 and the third node N3, being turned on or off in response to a second control signal C2. The NMOS transistor 413 is connected between the third node N3 and the ground voltage, being turned on or off in response to a third control signal C3. And, the NMOS transistor 416 is connected between the virtual power node VPN and the first node N1, being turned on or off in response to a fourth control signal C4. The first and second control signals, C1 and C2, are provided from the page-buffer decoding block 600. The third and fourth control signals, C3 and C4, are provided from the control logic block 500 shown in FIG. 3.

The main register 420 is comprised of a main latch 427 and four NMOS transistors 421, 422, 423, and 426. The main latch 427 is composed of third and fourth inverters 424 and 425. The third and fourth inverters, 424 and 425, are connected between fourth and fifth nodes N4 and N5.

The NMOS transistor 421 is connected between the fourth and sixth nodes N4 and N6, being turned on or off in response to a fifth control signal C5. The NMOS transistor 422 is connected between the fifth and sixth nodes N5 and N6, being turned on or off in response to a sixth control signal C6. The NMOS transistor 423 is connected between the sixth node N6 and the ground voltage, being turned on or off in response to a seventh control signals C7. The NMOS transistor 426 is connected between the sensing node SO and the fourth node N4, being turned on or off in response to an eighth control signal C8. Here, the fifth through eighth control signals C5~C8 are provided from the control logic block 500 shown in FIG. 3.

The loading circuit 430 is constituted of a single PMOS transistor 431. The PMOS transistor 431 is connected between the power source voltage and the sensing node SO, driving the power source voltage into the sensing node SO in response to a ninth control signal C9. Here, the ninth control signal C9 is provided from the control logic block 500 shown in FIG. 3.

The sensing circuit 445 is composed of two NMOS transistors 441 and 443. The NMOS transistor 441 is connected with the virtual power node VPN, being turned on or off in response to a tenth control signal C10. The tenth control signal C10 is also provided from the control logic block 500 shown in FIG. 3. The NMOS transistor 443 is connected between the NMOS transistor 441 and the ground voltage, being turned on or off in response to a voltage level of the sensing node SO.

The dumping circuit 446 is composed of two NMOS transistors 442 and 444. The NMOS transistor 442 is connected to the virtual power node VPN, being turned on or off in response to a voltage level of the first node N1. The NMOS transistor 444 is connected between the NMOS transistor 442 and the ground voltage, being turned on or off in response to an eleventh control signal C11. Here, the eleventh control signal C11 is provided from the control logic block 500 shown in FIG. 3.

The data output circuit 446 is constituted of two NMOS transistors 451 and 452. The NMOS transistor 452 is connected to a data output line DOL, being turned on or off in response to the seventh control signal C7. The NMOS transistor 451 is connected between the NMOS transistor 452 and the ground voltage, being turned on or off in response to a voltage level of the fifth node N5.

In the page buffer 400a shown in FIG. 4, the first through eleventh control signals C1~C11 are activated while conducting the following operations.

The first through third control signals C1~C3 are activated during reset and data-loading operations in the cache latch 417. The data-loading operation means an operation for inputting a data bit, which will be programmed, into the cache latch 417. The first and second control signals, C1 and C2, are complementary in logic level. Namely, when the first control signal C1 is at logic high level (H), the second control signal C2 maintains logic low level (L).

The fourth control signal C4 is activated in initial read and '01' verifying operations. The fifth control signal C5 is activated in a dumping operation. The dumping operation means an operation for transferring a data bit from the cache latch 417 to the main latch 427. The sixth control signal C6 is activated during reset, '10' verifying, and '00' verifying operations in the main latch 427. The seventh control signal C7 is activated during reset and data output operations in the main latch 427. The eighth control signal C8 is activated in a program-executing operation. The ninth control signal C9 is activated in a precharging operation. The tenth control signal C10 is activated in the initial read, '10' verifying, '00' verifying, and '01' verifying operations. The eleventh control signal C11 is activated in the dumping operation.

Now, operations of the page buffer shown in FIG. 4 will be described with reference to FIGS. 5 through 8.

Figure 5:
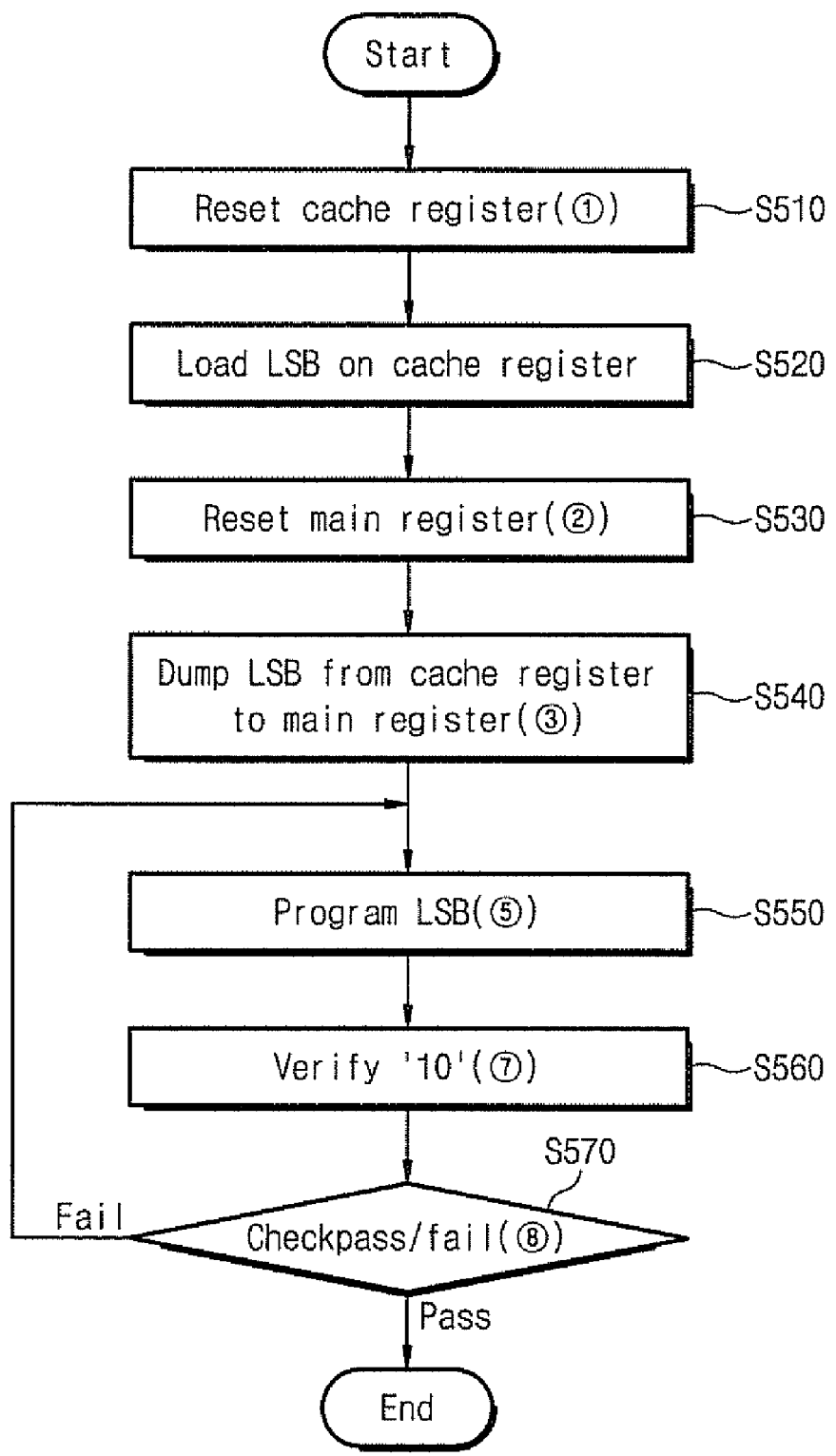
FIG. 5 is a flow chart showing an LSB programming operation in the NAND flash memory device according to some embodiments of the invention.
Figure 6:
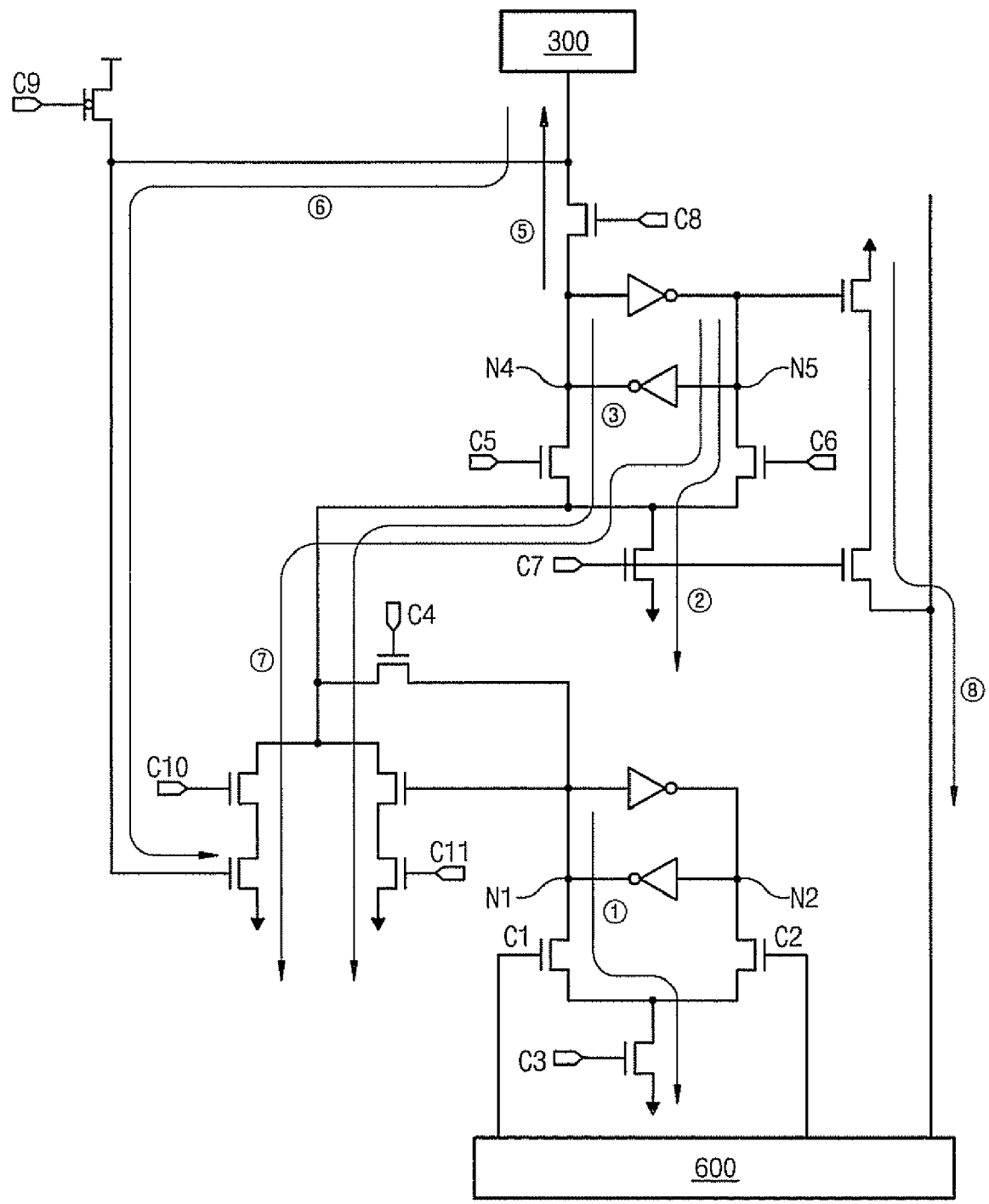
FIG. 6 is a circuit diagram illustrating data flows during the LSB programming operation.

FIG. 5 is a flow chart showing an LSB programming operation in a NAND flash memory device according to some embodiments of the invention, and FIG. 6 is a circuit diagram illustrating data flows during the LSB programming operation. Hereinafter, the LSB programming operation will be explained in conjunction with FIGS. 5 and 6.

First, Block S510 is carried out to reset the cache register 410. In Block S510, the first and third control signals, C1 and C3, are activated to form a first path ①. During this operation, the first node N1 becomes logic low level while the second node N2 becomes logic high level.

Block S520 is carried out to load an LSB into the cache register 410. If the LSB is '1', the first control signal C1 is activated. During this operation, the first and second nodes, N1 and N2, stay on logic low and high levels, respectively. Here, the fact that the first node N1 is set on logic low level means the cache register 410 does not function any more in the subsequent LSB programming operation. Otherwise, if the LSB is '0', the second control signal C2 is activated. During this operation, the first node N1 changes into logic high level and the second node N2 changes to logic low level.

Block S530 is carried out to reset the main register 420. In Block S530, the sixth and seventh control signals, C6 and C7, are activated to form a second path ②. During this operation, the fourth node N4 becomes logic high level while the fifth node N5 becomes logic low level.

Block S540 is carried out to dump an LSB into the main register 420 from the cache register 410. In Block S540, the fifth and eleventh control signals, C5 and C11, are activated to form a third path ③. But, the third path ③ may be interrupted by a voltage level of the first node N1. Namely, when the first node N1 is at logic high level, the third path ③ is formed therethrough. Otherwise, when the first node N1 is being on logic low level, the third path ③ is interrupted.

When the LSB of '1' is loaded on the cache register 410, the first node N1 still remains logic low level. During this operation, since the third path ③ is interrupted, the fourth node N4 retains logic high level. In contrast, when the LSB of '0' is loaded on the cache register 410, the first node N1 stays in logic high level. During this operation, since the third path ③ is formed to be conductive, the fourth node N4 changes to logic high level.

That is, by the data dumping operation, the fourth node N4 goes to logic high level when the LSB is '1', or goes to logic low level when the LSB is '0'.

Block S550 is carried out for the LSB programming operation. In Block S550, the eighth control signal C8 is activated to form a third path ⑤. A result of this LSB programming operation is variable in accordance with a voltage level at the fourth node N4. In other words, when the fourth node N4 stays at logic high level, it is conditioned in program inhibition. During this operation, the memory cell corresponding thereto keeps an erased state (or data '1'). Otherwise, when the fourth node N4 stays at logic low level, the corresponding memory cell is programmed into data '0'. As other programming operations are well known in this art, they will not be further described.

Block S560 is carried out to conduct the '10' verifying operation. In Block S560, the sixth and tenth control signals, C6 and C10, are activated to form a seventh path ⑦. But, the seventh path ⑦ may be interrupted by a voltage level of the sense node SO. Namely, when the sense node SO is at logic high level, the seventh path ⑦ is formed therethrough. Otherwise, when the sense node SO is at logic low level, the seventh path ⑦ is interrupted. Here, the '10' verifying operation is programmed in the case of LSB-programming a memory cell into the '10' state. If there is an input of an LSB '0', the fourth node N4 is set on logic low level.

First, considering the case that a memory cell does not reach the '10' state, the sense node SO remains at logic low level because the '10' verifying voltage V10 is higher than a threshold voltage of the corresponding memory cell. During this operation, since the seventh path ⑦ is interrupted thereby, the fourth node N4 retains logic low level. Here, the fact that the fourth node N4 retains logic low level means it will resume a programming operation thereafter.

Next, considering the case that a memory cell reaches the '10' state, the sense node SO remains at logic high level because the '10' verifying voltage V10 is lower than a threshold voltage of the corresponding memory cell. During this operation, since the seventh path ⑦ is being conductive, the fourth node N4 retains logic high level. Here, the fact that the fourth node N4 goes to logic high level means it terminates the programming operation.

Block S570 is carried out to check out whether a programmed memory cell is in a pass or fail condition. In Block S570, the seventh control signal C7 is activated to form an eighth path ⑧. But, the eighth path ⑧ may be interrupted in accordance with a voltage level of the fifth node N5. Namely, when the fifth node N5 is at logic high level, the eighth path ⑧ becomes conductive. Otherwise, when the fifth node N5 is at logic low level, the eighth path ⑧ is interrupted thereby.

When the fifth node N5 remains at logic low level, the data output line DOL is being precharged. Otherwise, when the fifth node N5 is at logic low level, the data output line DOL is discharged. A voltage level of the data output line DOL is transferred to a pass/fail checking circuit (not shown) through the page-buffer decoding circuit 600. The pass/fail checking circuit determines whether the programmed memory cell corresponding thereto is conditioned in a pass or fail state. From the determination, if the memory cell is detected as being failed, it resumes the operations of Blocks S550 through S570. But, if the memory cell is detected as being passed, the LSB programming operation is terminated.

Figure 7:
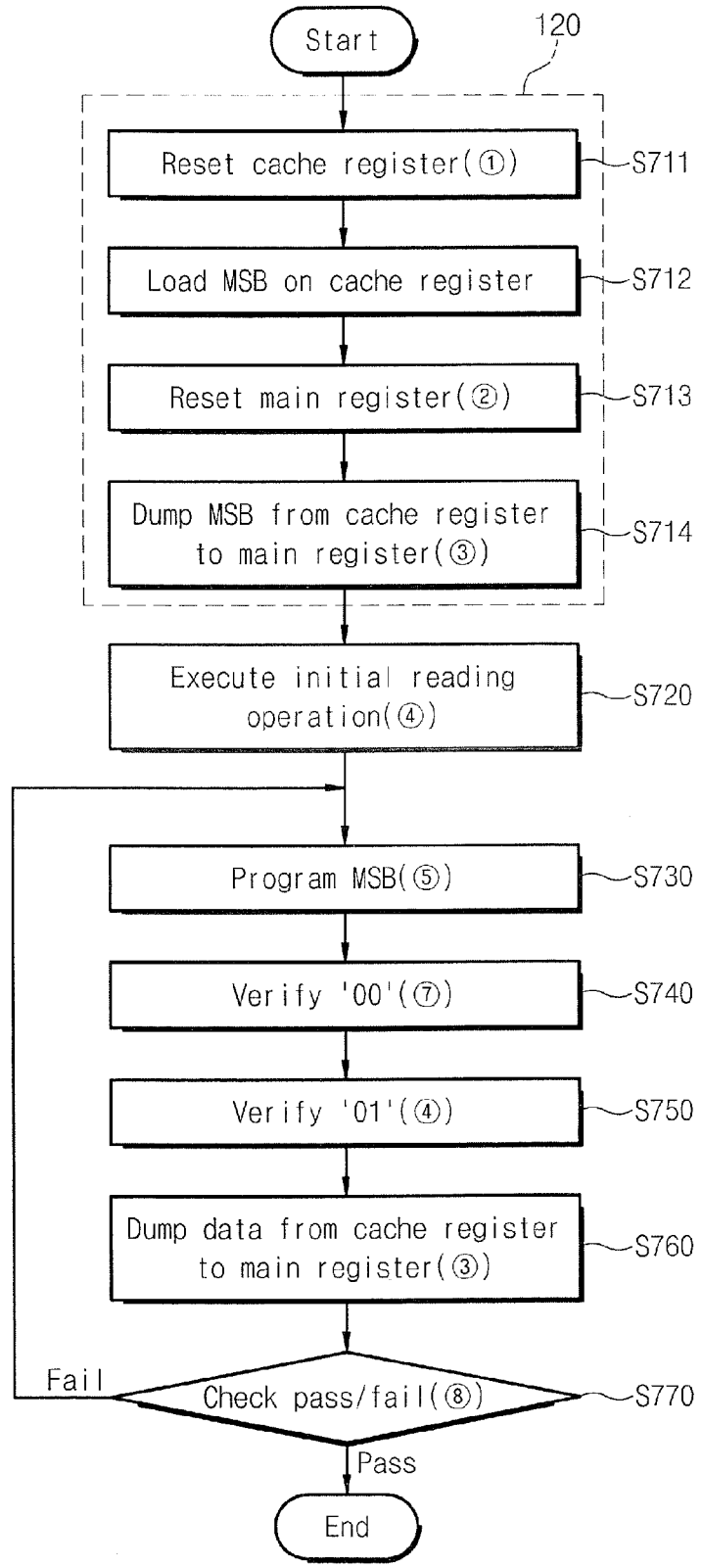
FIG. 7 is a flow chart showing an MSB programming operation in the NAND flash memory device according to some embodiments of the invention.
Figure 8:
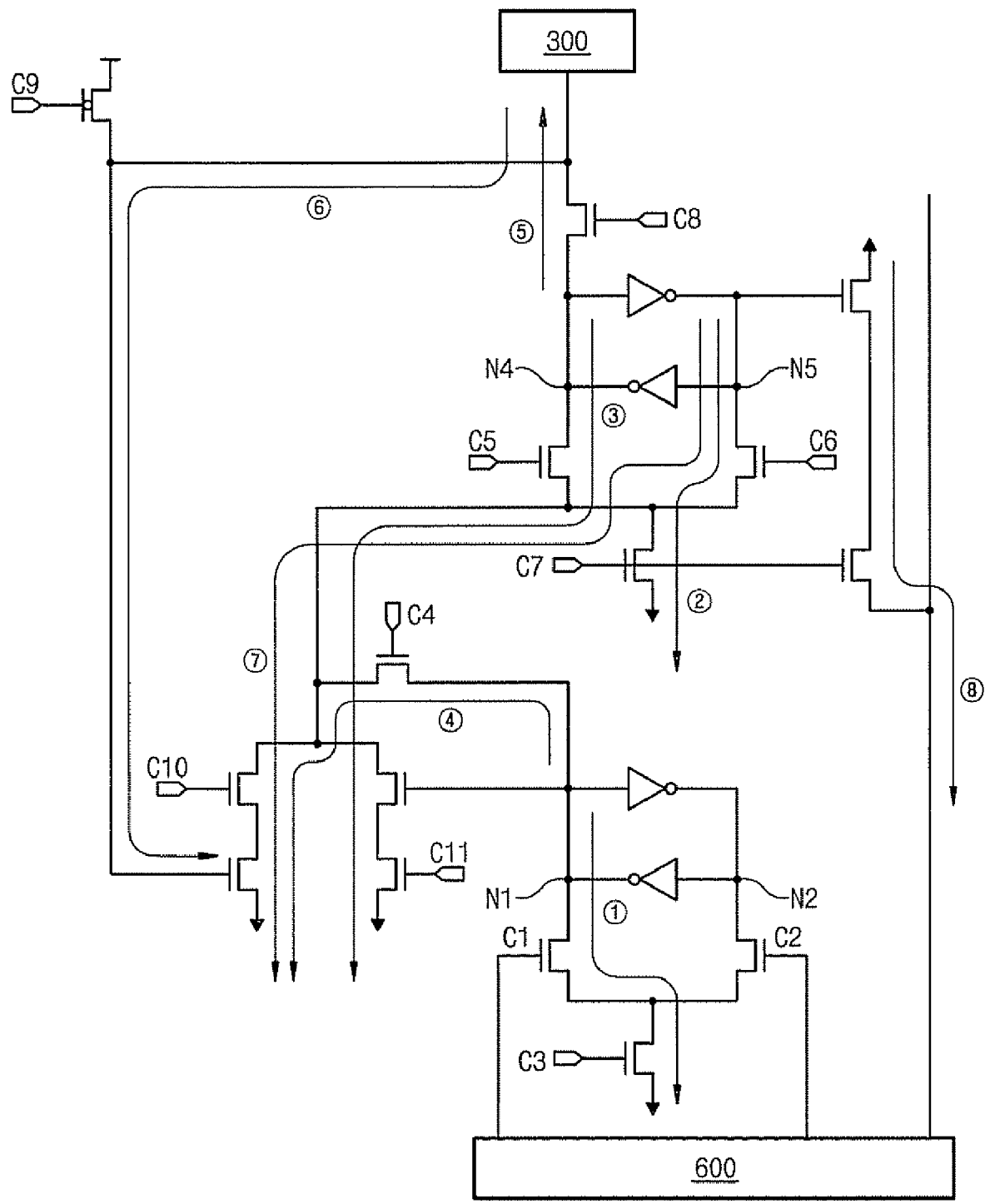
FIG. 8 is a circuit diagram illustrating data flows during the MSB programming operation.

FIG. 7 is a flow chart showing an MSB programming operation in a NAND flash memory device according to some embodiments of the invention, and FIG. 8 is a circuit diagram illustrating data flows during the MSB programming operation. Hereinafter, the MSB programming operation will be described with reference to FIGS. 7 and 8.

First, Block S710 is carried out in the sequence of resetting the cache register 410 (Block S711), loading an MSB into the cache register 410 (Block S712), resetting the main register 420 (Block 713), and dumping the MSB from the cache register 410 into the main register 420 (Block S714), similar to Blocks S510~S550 of the LSB programming operation shown in FIG. 5. When the MSB is '0', the first node N1 is set at logic high level while the fourth node N4 is set at logic low level.

Block S720 is carried out to execute an initial read operation. In Block S720, the fourth and tenth control signals, C4 and C10, are activated to form a fourth path ④. But, the fourth path ④ may be interrupted by a voltage level at the sense node SO. Namely, when the sense node SO is at logic high level, the fourth path ④ becomes conductive. When the sense node SO is at logic low level, the fourth path ④ is interrupted thereby.

Here, the initial read operation is provided for reading an LSB from a selected memory cell. In other words, the initial read operation is directed to find whether the selected memory cell is being conditioned in the '11' or '10' state. The initial read operation is performed without initialization for the page buffer. An LSB obtained by the initial read operation is stored in the cache register 410. After transferring the MSB to the main register 420 from the cache register 410, the initial read operation is carried out without initializing the cache register 410. By the initial read operation, the fourth path ④ is formed or interrupted in accordance with the LSB stored in the memory cell.

First, considering the case of conditioning a memory cell into the '10' state by the LSB programming operation, the sense node SO becomes logic high level because the initial read voltage Vrd (refer to FIG. 2) is lower than a threshold voltage of the memory cell. During this operation, since the fourth path ④ is formed, the first node N1 changes to logic low level. Here, the fact that the first node N1 becomes logic low level means the cache register 410 does not function any more in the subsequent MSB programming operation.

Next, considering the case that a memory cell is in the '11' state, the sense node SO becomes logic low level because the initial read voltage Vrd is higher than a threshold voltage of the memory cell. During this operation, since the fourth path ④ is interrupted, the first node N1 retains logic high level.

From the initial read operation, if the memory cell is in the '11' state, the first node N1 retains logic high level. But, if the memory cell is in the '10' state, the first node N1 changes to logic low level.

Block S730 is carried out to conduct the MSB programming operation, similar to the Block S550 of the LSB programming operation shown in FIG. 5. When the fourth node N4 is at logic high level, it is conditioned in program inhibition. During this operation, the memory cell retains the '10' or '11' state. Otherwise, if the fourth node N4 is laid on logic low level, the memory cell is programmed into the '00' or '01' state.

Block S740 is carried out to conduct the '00' verifying operation. The '00' verifying operation is provided to detect whether a memory cell has been successfully programmed into the '00' state from the '10' state. In Block S740, the sixth and tenth control signals, C6 and C10, activated to form the seventh path ⑦. The seventh path ⑦ may be interrupted by a voltage level at the sense node SO.

If the memory cell does not reach the '00' state, the '00' verifying voltage $V_{00}$ is higher than a threshold voltage of the memory cell. During this operation, since the sense node SO is at logic low level, the seventh path ⑦ is interrupted thereby. Here, the fact that the fourth node N4 retains logic low level means it resumes a programming operation thereafter. If the memory cell reaches the '10' state, the '10' verifying voltage $V_{10}$ is lower than a threshold voltage of the memory cell. During this operation, since the sense node SO is at logic high level, the seventh path ⑦ becomes conductive. Thus, the fourth node N4 changes into logic high level.

Here, the fact that the fourth node N4 goes to logic high level means it terminates the programming operation.

Through the '00' verifying operation after completing the MSB programming operation from the '10' state to the '00' state, the first node N1 is set at logic low level and the fourth node N4 becomes logic high level. A voltage level of the fourth node N4 does not change even by the subsequent MSB programming operation, because the first node N1 is being held at logic low level.

Block S750 is carried out to conduct the '01' verifying operation. The '01' verifying operation is provided to detect whether a memory cell has been successfully programmed into the '01' state from the '11' state. In Block S740, the fourth and tenth control signals, C4 and C10, are activated to form the fourth path ④. The fourth path ④ may be interrupted by a voltage level at the sense node SO.

Meanwhile, before the '01' verifying operation, the first node N1 of the cache register 410 and the fourth node N4 of the main register 420 are charged at voltage levels as follows. Since the memory cell has been conditioned in the '11' state during the initial read operation, the first node N1 of the cache register 410 remains at logic high level. As a threshold voltage of the memory cell is higher than the '00' verifying voltage $V_{00}$ during the '00' verifying operation, the fourth node N4 of the main register 420 is set at logic high level.

First, the case when the threshold voltage of the memory cell is higher than the '00' verifying voltage $V_{00}$, but lower than the '01' verifying voltage $V_{01}$, will be described. When the '01' verifying voltage $V_{01}$ is applied to the memory cell, the sense node SO becomes logic low level because the '01' verifying voltage $V_{01}$ is lower than the threshold voltage of the memory cell. As the sense node SO is in logic low level, the fourth path ④ is interrupted while the first node N1 retains logic high level. Block S760 is carried out to dump a data bit into the main register 420 from the cache register 410. In Block S760, as the first node N1 retains logic high level, the third path ③ becomes conductive. During this operation, the fourth node N4 changes into logic low level. If the fourth node N4 becomes logic low level, the memory cell is determined as being failed in Block S770. And, it resumes the operations of Blocks S730 through S770.

Next, the case when the threshold voltage of the memory cell is higher than the '01' verifying voltage $V_{01}$ will be described. Through repetition of the MSB programming operation, the threshold voltage of the memory cell becomes higher than the '01' verifying voltage $V_{01}$. When the '01' verifying voltage $V_{01}$ is applied to the memory cell, the sense node SO goes to logic high level because the '01' verifying voltage $V_{01}$ is lower than the threshold voltage of the memory cell. During this operation, the fourth path ④ is formed to change the first node N1 into logic low level. In Block S760, since the first node N1 changes into logic low level, the third path ③ is interrupted thereby. Meanwhile, the fourth node N4 retains logic high level. If the fourth node N4 is set on logic high level, the memory cell is determined as being passed in the Block S770 and thereby the MSB programming operation is terminated.

As aforementioned, NAND flash memory devices and methods of programming according to some embodiments of the invention allow a multi-bit programming operation to be conducted. In particular, in conducting an MSB programming operation from the '11' state to the '01' state, some embodiments of the invention prevent a memory cell from being set as a program-inhibited cell even before the memory cell reaches the '01' state.

In the drawings and specification, there have been disclosed embodiments of the invention and, although specific terns are employed, they are used in a generic and descriptive sense only and not for purposes of limitation, the scope of the invention being set forth in the following claims.

What is claimed is:

1. A method of programming multiple bits in a NAND flash memory device, comprising:
   programming a memory cell with a Least Significant Bit (LSB);
   storing the LSB into a cache register from the memory cell;
   programming the memory cell with a Most Significant Bit (MSB) that is stored in a main register;
   storing a data bit into the main register from the memory cell during a first verifying operation;
   storing a data bit into the cache register from the memory cell during a second verifying operation; and
   transferring the data bit to the main register from the cache register;
   wherein the first verifying operation is a '00' verifying operation;
   wherein the second verifying operation is a '01' verifying operation; and
   wherein if the memory cell is conditioned in a '01' state after the '01' verifying operation, the data bit of the cache register is changed.

2. The method as set forth in claim 1, wherein if the memory cell is conditioned in a '00' state after the '00' verifying operation, the main register is set for program inhibition.

3. The method as set forth in claim 1, wherein the main register is set for program inhibition in accordance with the changed data bit of the cache register.

4. The method as set forth in claim 1, wherein if a threshold voltage of the memory cell is higher than a '00' verifying voltage but lower than a '01' verifying voltage, after the '01' verifying operation, the data bit of the cache register is maintained without change.

5. The method as set forth in claim 4, wherein the main register is set to conduct a programming operation in accordance with the data bit of the cache register.

6. The method as set forth in claim 1, which further comprises, after programming the LSB into the memory cell:
   resetting the cache register;
   loading the MSB in the cache register;
   resetting the main register; and
   transferring the MSB to the main register from the cache register.

7. The method as set forth in claim 6, wherein after transferring the MSB to the main register from the cache register, the LSB is read out from the memory cell without initializing the cache register.

8. The method as set forth in claim 1, wherein programming the LSB comprises:
   resetting the cache register;
   loading the LSB in the cache register;
   resetting the main register;
   dumping the LSB to the main register from the cache register; and
   executing an LSB programming operation in accordance with the LSB of the main register.

9. The method as set forth in claim 8, which further comprises, after the LSB programming operation:
   executing a third verifying operation by applying a third verifying voltage, which is lower than a voltage of the first verifying operation, to the memory cell.

10. The method as set forth in claim 9, wherein the third verifying operation is a '10' verifying operation.

11. The method as set forth in claim 10, wherein if the memory cell is conditioned in a '10' state after the '10' verifying operation, the main register is set for program inhibition.

12. A NAND flash memory device comprising:
a memory cell configured to store multi-bit data;
a main register configured to store data to be programmed in the memory cell;
a cache register configured to store data supplied from an external source;
a sensing circuit configured to enable storing data from the memory cell into the cache register during an initial read operation, storing data from the memory cell into the main register during a first verifying operation, and storing data from the memory cell into the cache register during a second verifying operation; and
a dumping circuit configured to transfer data from the cache register to the main register;
wherein the first verifying operation is a '00' verifying operation;
wherein the second verifying operation is a '01' verifying operation; and
wherein if the memory cell is conditioned in a '01' state after the '01' verifying operation, the data bit of the cache register is changed.

13. The NAND flash memory device as set forth in claim 12, wherein if the memory cell is conditioned in a '00' state after the '00' verifying operation, the main register is set for program inhibition.

14. The NAND flash memory device as set forth in claim 12, wherein if the memory cell is conditioned in a '01' state after the '01' verifying operation, the main register is set for program inhibition.

15. The NAND flash memory device as set forth in claim 12, wherein if a threshold voltage of the memory cell is higher than a '00' verifying voltage but lower than a '01' verifying voltage, after the '01' verifying operation, the main register is set to conduct a programming operation.

16. The NAND flash memory device as set forth in claim 15, wherein the main register is set to conduct the programming operation in accordance with the data bit of the cache register.

* * * * *